(12) United States Patent
Smith et al.

(10) Patent No.: US 7,466,175 B2
(45) Date of Patent: Dec. 16, 2008

(54) CAPACITANCE MULTIPLIER CIRCUIT

(75) Inventors: Joe M. Smith, Scottsdale, AZ (US);
Gary P. English, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 3 days.

(21) Appl. No.: 11/617,826

(22) Filed: Dec. 29, 2006

(65) Prior Publication Data
US 2008/0157866 A1 Jul. 3, 2008

(51) Int. Cl.
*H03K 5/00* (2006.01)
*H03L 7/06* (2006.01)

(52) U.S. Cl. ............... 327/156; 327/552; 327/558; 327/524

(58) Field of Classification Search ......... 327/552–559, 327/147, 156, 524
See application file for complete search history.

(56) References Cited

U.S. PATENT DOCUMENTS

| | | | |
|---|---|---|---|
| 3,911,296 A | 10/1975 | Davis | |
| 4,709,159 A | 11/1987 | Pace | |
| 5,623,523 A * | 4/1997 | Gehrke | 375/376 |
| 5,726,599 A * | 3/1998 | Genest | 327/553 |
| 6,091,289 A * | 7/2000 | Song et al. | 327/558 |
| 6,344,772 B1 | 2/2002 | Larsson | |
| 6,778,004 B1 * | 8/2004 | Jackson | 327/538 |
| 6,788,146 B2 * | 9/2004 | Forejt et al. | 330/257 |
| 7,205,826 B2 * | 4/2007 | Kim et al. | 327/538 |
| 7,307,460 B2 * | 12/2007 | Robinson et al. | 327/148 |

OTHER PUBLICATIONS

G. A. Rincon-mora, "Active Capacitor Multiplier in Miller-Compensated Circuits," IEEE J. Solid State Circuits, vol. 35, No. 1, pp. 26-32, Jan. 2000

* cited by examiner

*Primary Examiner*—Dinh T. Le

(57) ABSTRACT

An integrated circuit including a capacitance multiplier having reduced parasitics and injected noise compared to conventional multiplier methods. The integrated circuit includes a reference capacitor and a current mirror arrangement coupled to the reference capacitor. The current mirror arrangement, which includes a current gain factor N, varies the capacitance of the reference capacitor by a factor of N+1, based on the reference capacitor current. The current mirror arrangement includes an operational amplifier operating in conjunction with two mirror transistors to form a current mirror arrangement having little or no series resistance. The current mirror also can include a plurality of resistors configured to reduce the noise from the capacitance multiplier, thus making the capacitance multiplier useful for applications that may require relatively low noise.

13 Claims, 4 Drawing Sheets

CAPACITANCE MULTIPLIER CIRCUIT

BACKGROUND OF THE INVENTION

1. Field of the Invention

The invention relates to capacitance multiplier circuits. More particularly, the invention relates to capacitance multiplier circuits having reduced capacitor parasitics and reduced noise.

2. Description of the Related Art

A capacitance multiplier is an electronic circuit that uses a relatively small physical capacitance to approximate a relatively larger capacitance value. Often, a capacitance multiplier is a transistor configured to multiply the value of a capacitor coupled to the base of the transistor by an amount equal to the transistor's gain, also known as beta ($\beta$). In many applications, a capacitance multiplier can be used to reduce the physical size of a capacitor in a design. For example, in an integrated circuit application where the maximum size of an on-chip capacitor may be 10 picofarads (pF) or less, a 20 times (20×) multiplier will allow capacitors of 200 pF or possibly greater to be realized on the integrated circuit chip. Other cases in which a capacitance multiplier can be used to reduce the physical size of a capacitor in a design include a miniature printed circuit board (PCB) or ceramic radio frequency (RF) modules where phase locked loop (PLL) filter capacitor values and their corresponding sizes are relatively large compared to other circuitry. Another application for using capacitance multipliers to reduce the physical size of a capacitor includes relatively low frequency filters or PLL filters with a relatively narrow loop bandwidth. In these cases, it may be difficult to implement relatively high quality capacitors, which fall in the microfarad range, in a physical size that is practical.

One problem with many conventional implementations of capacitance multiplier circuits is that the capacitor parasitics may be relatively large. In particular, the series resistance of a conventional transistor-based current mirror implementation of a capacitance multiplier may be unacceptably large, particularly in many applications that require a capacitor with a relatively large capacitance. Another problem that may occur in conventional implementations of capacitance multiplier circuits is that the noise injected into the circuit by the capacitance multiplier may degrade the performance of the associated circuits. This is particularly true in PLL applications where the capacitance multiplier replaces the dominate pole capacitor in the loop filter. In these cases, the noise of the capacitance multiplier may be large enough to degrade the PLL phase noise performance. In filter applications, the noise injected by a capacitance multiplier also can be of concern since the injected noise effectively raises the noise floor of the signal. If the filter is used in a receiver or some other noise critical system, the added noise may not be acceptable.

DETAILED DESCRIPTION

Figure 1:
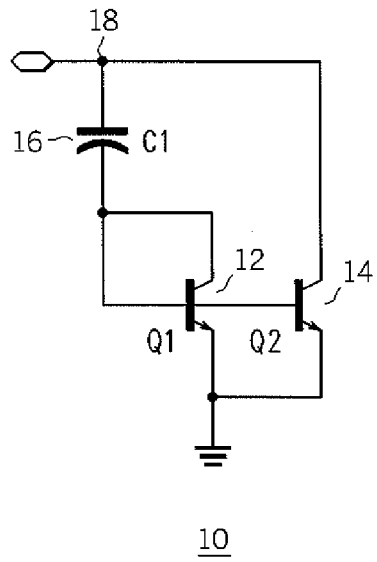
FIG. 1 is a schematic diagram of a conventional transistor-based capacitance multiplier circuit.

In the following description, like reference numerals indicate like components to enhance the understanding of the capacitance multiplier circuits through the description of the drawings. Also, although specific features, configurations and arrangements are discussed hereinbelow, it should be understood that such specificity is for illustrative purposes only. A person skilled in the relevant art will recognize that other steps, configurations and arrangements are useful without departing from the spirit and scope of the invention.

The capacitance multiplier circuits described herein involve operational amplifier (op-amp)-based capacitance multiplier circuits that reduce the amount of noise injected in the overall application circuit and reduce the parasitic resistance relative to many conventional multiplier methods. The inventive capacitance multiplier circuits are based on an op-amp operating in conjunction with two mirror transistors to form a precision current mirror having little or no series resistance. The input of the current mirror arrangement senses the current through a reference capacitor. The output of the current mirror arrangement is connected in parallel with the reference capacitor. The overall arrangement forms a capacitance multiplier with a multiplication factor of N+1, where N is the current gain or current gain factor of the current mirror arrangement. Also, two resistors in the current mirror arrangement act to reduce the noise from the capacitance multiplier, thus making the capacitance multiplier useful for applications that may require relatively low noise.

Referring now to FIG. 1, shown is a schematic diagram of a conventional capacitance multiplier circuit 10. The circuit 10 includes a first NPN transistor 12 (Q1) and a second NPN transistor 14 (Q2) coupled in a configuration that forms a current mirror. Alternatively, the current mirror can be formed by a single, multiple collector device rather than the separate, matched devices Q1 and Q2 shown. The transistor Q2 is scaled in area to be K times the area of the transistor Q1. A capacitor 16 (C1) is coupled to the transistors Q1 and Q2 as shown. The current through the capacitor C1, $I_{C_1}$, also flows through the first transistor Q1. Thus, the current through the second transistor Q2, $I_{C_2}$, is approximately $K \times I_{C_1}$. The impedance at a node 18 is primarily capacitive and has an effective capacitance of approximately $C1 \times (1+K)$. It should be noted that the circuit 10 does not show a bias network for the transistors Q1 and Q2. The bias network supplies a current to transistors Q1 and Q2 such that the net current into the circuit 10 at the node 18 is close to zero.

Figure 2:
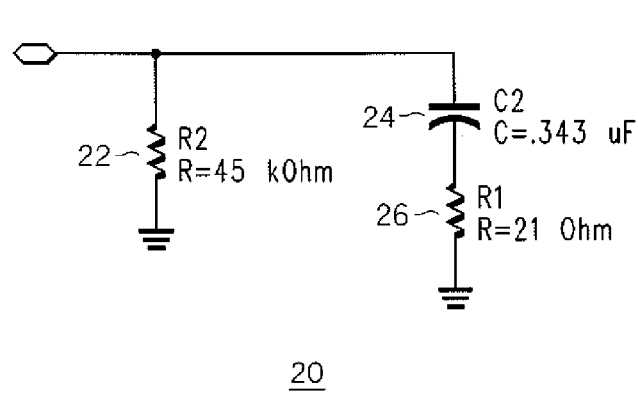
FIG. 2 is a schematic diagram of an equivalent circuit for the conventional capacitance multiplier circuit of FIG. 1.

Referring now to FIG. 2, with continuing reference to FIG. 1, shown is a schematic diagram of an equivalent circuit 20 for the conventional capacitance multiplier circuit 10 of FIG. 1. The equivalent circuit 20 includes a first branch, having a resistor 22 (R2), coupled in parallel to a second branch, having a capacitor 24 (C2) and a resistor 26 (R1) coupled in series. As an example, in the capacitance multiplier circuit 10 of FIG. 1, the capacitance of the capacitor C1 is 0.066 microfarads (µF) and the K=4, i.e., the area of the transistor Q2 is 4 times the area of the transistor Q1.

In the example, the current through the transistor Q1 ($I_{C1}$) is 250 microamps (µA) and the current through the transistor Q2 ($I_{C2}$) is K×$I_{C1}$, or 4×250 µA=1 milliamp (mA). The equivalent multiplier capacitance is C1×(1+K)=0.066 µF×(1+4)=0.343 µF. The series resistance of the capacitance multiplier is 21 ohms. The value of the series resistance of the capacitance multiplier changes with the current through the transistor Q1. For example, when the current through the transistor Q1 changes from 500 µA to 125 µA, the series resistance of the capacitance multiplier changes from 10 ohms to 40 ohms, respectively. Also, the series resistance will be dependent on the characteristics of the transistors Q1 and Q2, although the given values are representative of what may be achieved typically. As discussed previously herein, PLL applications and other applications that desire a relatively low series resistance (i.e., a capacitor with a relatively high capacitance) may be negatively affected by the non-ideal model of the conventional capacitance multiplier circuit in FIG. 1 and FIG. 2.

Figure 3:
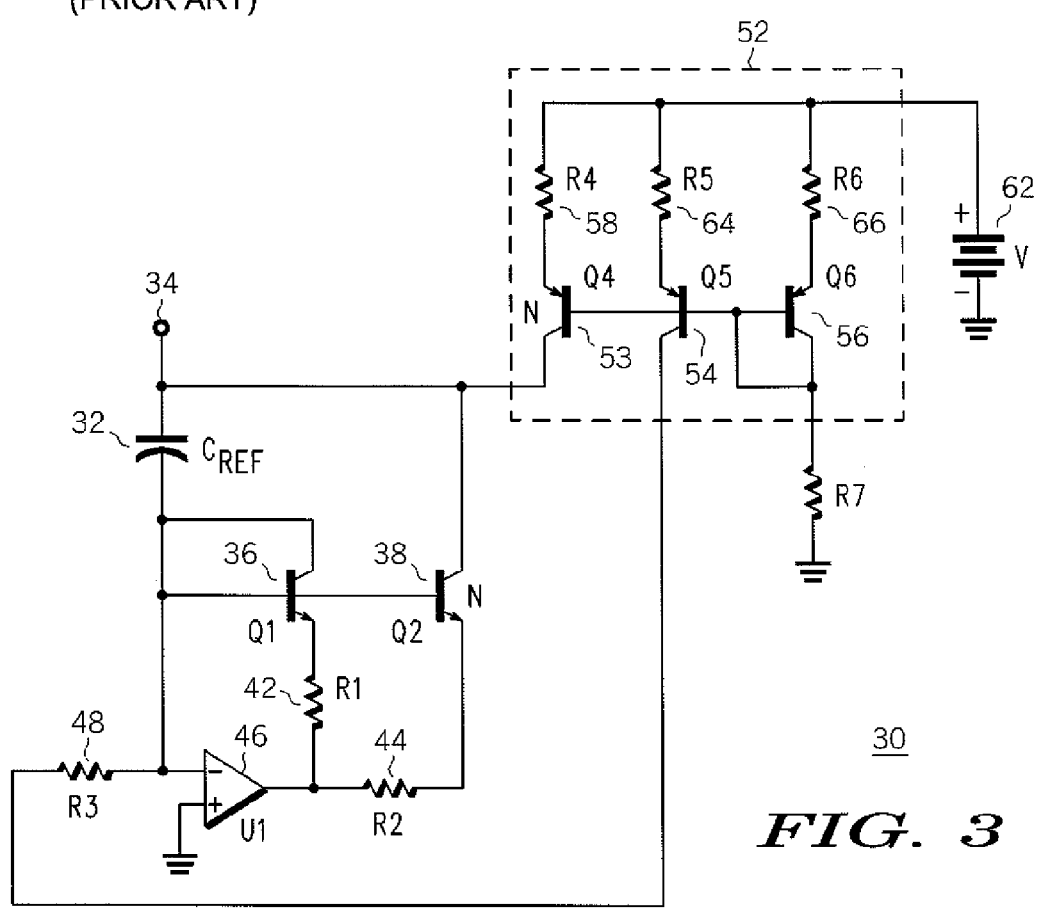
FIG. 3 is a schematic diagram of a capacitance multiplier circuit according to embodiments of the invention.

Referring now to FIG. 3, shown is a schematic diagram of a capacitance multiplier circuit 30 according to embodiments of the invention. The capacitance multiplier circuit 30 uses an operational amplifier (op amp) and current mirror arrangement to reduce the overall parasitics by providing a negligible parasitic series resistance and to reduce the amount of noise introduced by the capacitance multiplier circuit 30. The capacitance multiplier circuit 30 includes a reference capacitor 32 ($C_{REF}$) coupled between an input node 34 and a current mirror arrangement formed by a first NPN transistor 36 (Q1) and a second NPN transistor 38 (Q2). The second transistor Q2 is scaled in area to be N times the area of the first transistor Q1.

A first resistor 42 (R1) and a second resistor 44 (R2) are connected to the emitters of the first and second transistors Q1 and Q2, respectively, as shown. The resistance of the first resistor R1 is N times the resistance of the second resistor R2, i.e., R1=N×R2. An operational amplifier or op amp 46 (U1) is coupled between the node connecting the reference capacitor 32 and the Q1/Q2 current mirror arrangement, between the resistors R1 and R2, and between a point of reference potential, such as ground. More specifically, the inverting input of the op amp 46 is connected to the reference capacitor 32 and to the common base connection of the first transistor Q1 and the second transistor Q2. The inverting input of the op amp 46 also is connected to a third resistor 48 (R3), as shown. The non-inverting input of the op amp 46 is connected to the point of reference potential. The output of the op amp 46 is connected between the first resistor R1 and the second resistor R2, as shown.

The capacitance multiplier circuit 30 also includes a relatively high impedance bias current source arrangement 52 coupled to the reference capacitor 32 at the input node 34 and coupled to the current mirror arrangement at the collector of the second transistor Q2, as shown. The high impedance bias current source arrangement 52 includes a fourth PNP transistor 53 (Q4), a fifth PNP transistor 54 (Q5) and a sixth PNP transistor 56 (Q6) connected together as shown. The high impedance bias current source arrangement 52 also includes a fourth resistor 58 (R4) coupled between the emitter of the fourth PNP transistor Q4 and a voltage source 62, a fifth resistor 64 (R5) coupled between the emitter of the fifth PNP transistor Q5 and the voltage source 62, and a sixth resistor 66 (R6) coupled between the emitter of the sixth PNP transistor Q6 and the voltage source 62, as shown. The fourth transistor Q4 is scaled in area to be N times the area of the first transistor Q1, the fifth transistor Q5 and the sixth transistor Q6. Also, the resistance of each of the fifth resistor R5 and the sixth resistor R6 is N times the resistance of the fourth resistor R4, i.e., R5=N×R4 and R6=N×R4. Also, the high impedance bias current source arrangement 52 can include a seventh resistor 68 (R7) coupled between the sixth PNP transistor Q6 and a point of reference potential, such as ground.

As will be discussed in greater detail hereinbelow, the capacitance multiplier circuit 30 is configured to reduce the parasitic series resistance to nearly zero. Also, the equivalent capacitance of the capacitance multiplier circuit 30 at the input node 34 is (1+N)×$C_{REF}$, where N is the area scaling factor indicated, e.g., as discussed hereinabove in connection with transistors Q2 and Q4, and $C_{REF}$ is the capacitance of the reference capacitor 32. In this manner, the capacitance multiplier circuit 30 provides a lower loss (greater quality factor, Q) equivalent capacitor than does the conventional capacitance multiplier circuit 10 in FIG. 1. Also, since the resistance of the conventional capacitance multiplier circuit 10 in FIG. 1 is dependent on the bias current, a higher current mirror level may be required to achieve an acceptable level of series resistance in applications where the conventional capacitance multiplier circuit 10 is used.

Figure 4:
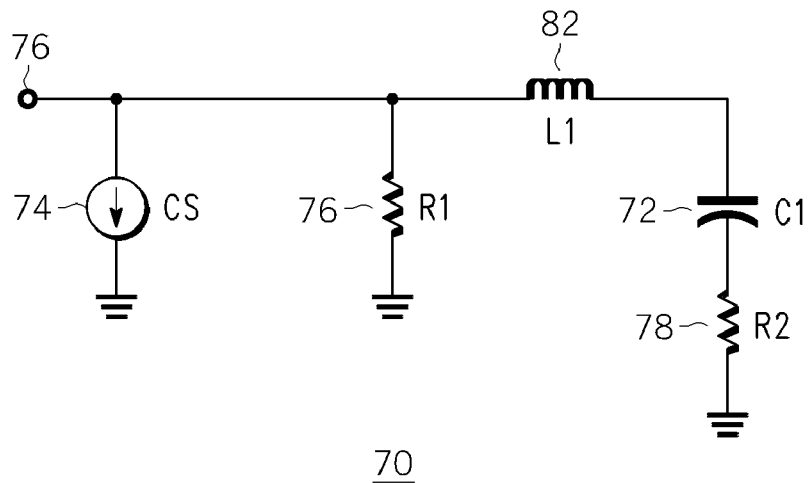
FIG. 4 is a schematic diagram of an equivalent circuit for the capacitance multiplier circuit of FIG. 3.

Referring now to FIG. 4, with continuing reference to FIG. 3, shown is a schematic diagram of an equivalent circuit 70 for the capacitance multiplier circuit 30 of FIG. 3. The equivalent circuit 70 includes an overall capacitance, represented by a capacitor 72 (C1). The equivalent circuit 70 also includes a relatively small leakage current, represented by a current source 74, as will be discussed in greater detail hereinbelow. The current source 74 is connected in parallel with the capacitor 72, between an input node 76 and a point of reference potential, such as ground. The equivalent circuit 70 also includes a parallel resistance 76 (R1) between the input node 76 and the point of reference potential, and a series resistance 78 (R2) between the capacitor 72 and the point of reference potential. The equivalent circuit 70 also includes a relatively small series inductance 82 (L1) between the input node 76 and the capacitor 72, as shown.

As an example, in the capacitance multiplier circuit 30 of FIG. 3, the capacitance of the reference capacitor 32 ($C_{REF}$) is 0.067 microfarads (µF) and N=4, i.e., the area of the transistor Q2 is 4 times the area of the transistor Q1. In this example, the overall equivalent capacitance (C1) is (N+1)×$C_{REF}$=(4+1)×0.067=0.33 µF. Both the series resistance (R2) and the parallel resistance (R1) are negligible up to an operating frequency of approximately 10 MHz, and therefore can be ignored for most practical cases at relatively low frequencies, i.e., frequencies less than 10 MHz.

The only parasitic element in the equivalent circuit 70 that is not negligible is the series inductance L1, which is a function of the bandwidth of the op amp 46. It should be noted that any parasitic resistance of the reference capacitor 32 can slightly change the value of one or more components of the capacitance multiplier circuit 30. Also, the value of the small leakage current, shown as the current source 74, which also is present in conventional capacitance multiplier circuits, is a function of the matching of the transistor bias circuits and will vary some over temperature and also vary with the voltage across the reference capacitor 32.

In operation, the capacitance multiplier circuit 30 makes use of the op amp 46 operating in conjunction with the first and second transistors Q1, Q2 to form a relatively precise current mirror that has little or no series resistance. The current flowing through the reference capacitance 32 also flows through the first transistor Q1 and the first resistor R1 since the inverting input of the op amp 46 is at virtual ground. Since the resistance of the first resistor R1 is N times the resistance of the second resistor R2 (i.e., R1=N×R2) and the area of the second transistor Q2 is N times the area of the first transistor Q1 (i.e., Q2=N×Q1), the current flowing through the second transistor Q2 is N times the current flowing through the first transistor Q1 (i.e., $I_{Q2}=N \times I_{Q1}$). The high impedance bias current source arrangement 52 for transistors Q1 and Q2 has negligible effect on the dynamic performance of the capacitance multiplier circuit 30. Accordingly, in operation, the capacitance multiplier circuit 30 essentially is a reference capacitor (i.e., the reference capacitor 32) in parallel with a relatively precise current-controlled current source. Such arrangement effectively forms a capacitance multiplier with a multiplication factor of N+1.

The first resistor R1 and the second resistor R2 play a relatively important role in improving the noise performance of the current mirror arrangement, i.e., in reducing the amount of noise to the capacitance multiplier circuit 30 by the current mirror arrangement. Without the first resistor R1 and the second resistor R2, the noise performance of the capacitance multiplier circuit 30 would be determined primarily by the noise characteristics of the first transistor Q1 and the second transistor Q2. In such a case, the noise performance of the capacitance multiplier circuit 30 often would be unacceptably large. The resistance of the first resistor R1 is N times the resistance of the second resistor R2 so that the voltage drop across the first resistor R1 and the voltage drop across the second resistor R2 are approximately equal, and the current mirrors are balanced. The relationship between the resistance values of the first resistor R1 and the second resistor R2 is a tradeoff between reducing the noise floor by increasing their resistance values and reducing the voltage drop across the resistors by reducing their resistance values.

To illustrate the beneficial performance of the inventive capacitance multiplier circuits described hereinabove, a simulation was performed to compare the noise performance of the inventive capacitance multiplier circuit with that of conventional arrangements and conventional capacitance multiplier circuit arrangements. In the simulation, a comparison was made of the noise contribution of the loop filter portion of a phase locked loop circuit, for various loop filter configurations, including configurations in which a capacitor in the loop filter circuit is replaced with a conventional capacitance multiplier circuit, and then replaced with a capacitance multiplier circuit according to embodiments of the invention. The comparison also includes the noise contribution of an op amp loop filter circuit.

Figure 5:
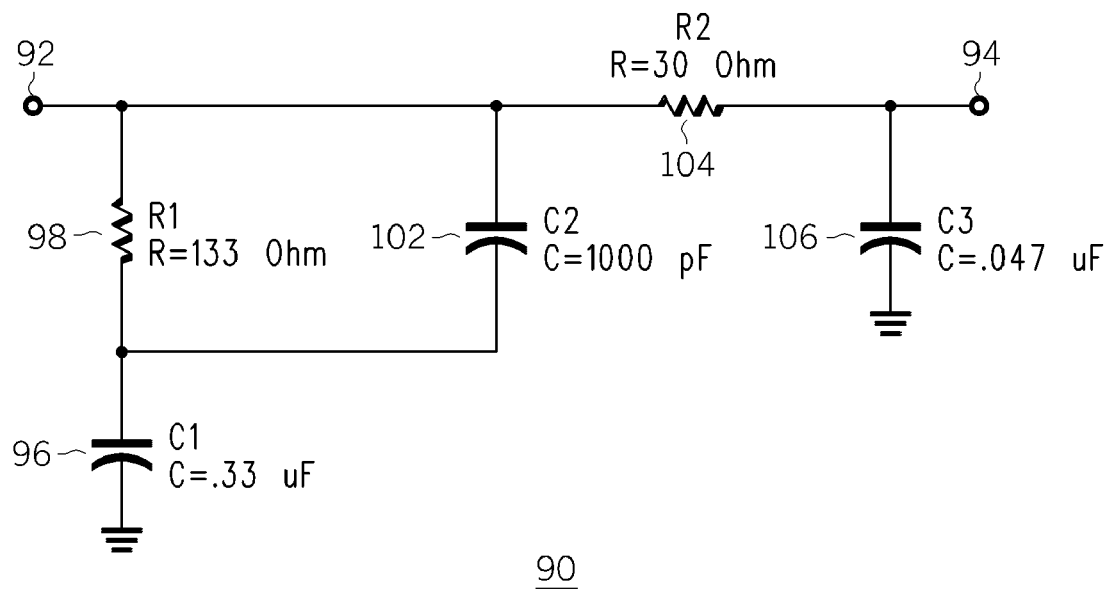
FIG. 5 is a schematic diagram of a conventional passive loop filter circuit for use in one particular phase locked loop (PLL) circuit.

Referring now to FIG. 5, shown is a schematic diagram of a conventional loop filter circuit 90 for use in a phase locked loop (PLL) circuit. The loop filter circuit 90 includes an input node 92, which typically is connected to the output of the charge pump (not shown) in the PLL, and an output node 94, which typically is connected to the input of the voltage-controller oscillator or VCO (not shown) in the PLL. The loop filter 90 includes a first capacitor 96 (C1) connected in series with a parallel combination of a first or loop filter resistor 98 (R1) and a second capacitor 102 (C2), between the input node 92 and a point of reference potential, such as ground. The loop filter 90 also can include a second resistor 104 (R2) connected between the input node 92 and the output node 94, and a third capacitor 106 (C3) connected between the output node 94 and the point of reference potential.

In general, the phase/frequency detector generates an error signal, based on the difference between an input signal and a reference signal, and the charge pump generates an amount of charge proportional to the error signal. The loop filter accumulates the net charge from the charge pump and generates a loop filter voltage, which is input to the VCO as a control signal that biases the VCO. The VCO generates a periodic output signal, the frequency of which is a function of the loop filter voltage.

For the simulation, the values of the components of the loop filter 90 are shown. Also, for the simulation, the gain of the VCO, $K_{VCO}$, is 60 megahertz per volt (MHz/V), and the gain of the phase detector, $K_{PD}$ is 160 microamps (µA). Also, in the simulation, the loop bandwidth is approximately 5 kilohertz (kHz).

Figure 6:
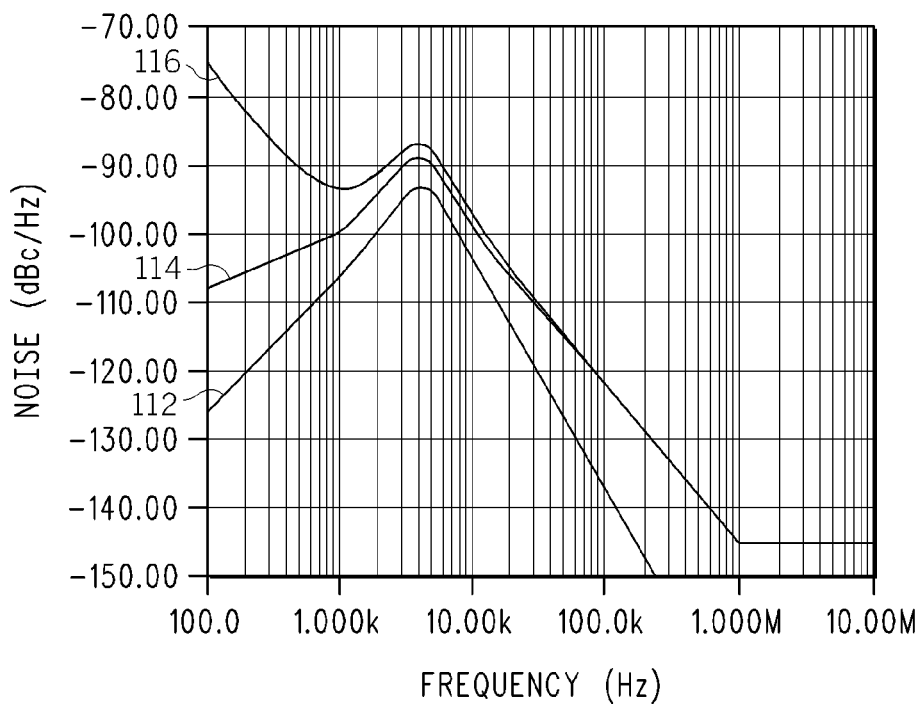
FIG. 6 is a graphical diagram of the total phase loop noise of a phase locked loop circuit using the loop filter of FIG. 5, including the loop filter noise contribution and the voltage-controlled oscillator (VCO) noise contribution, as a function of frequency.

Referring now to FIG. 6, shown is a graphical diagram 110 of the total phase loop noise of a phase locked loop circuit using the loop filter circuit 90 of FIG. 5. The noise is plotted in units of dBc per Hertz (dBc) as a function of frequency, where dBc is a unit of power ratio of a signal to a carrier signal in decibels (dB). The graphical diagram 110 includes a plot 112 of the loop filter noise, i.e., the noise contributed by the loop filter 90 to the total loop noise in the PLL circuit. The graphical diagram 110 also includes a plot 114 of the noise contributed by the VCO in the PLL circuit, i.e., the VCO noise. The VCO noise is based on the noise performance of a typical VCO used in a cellular phone application in the 900 MHz band. Also, the graphical diagram 110 includes a plot 116 of the total loop noise in the PLL circuit.

Figure 7:
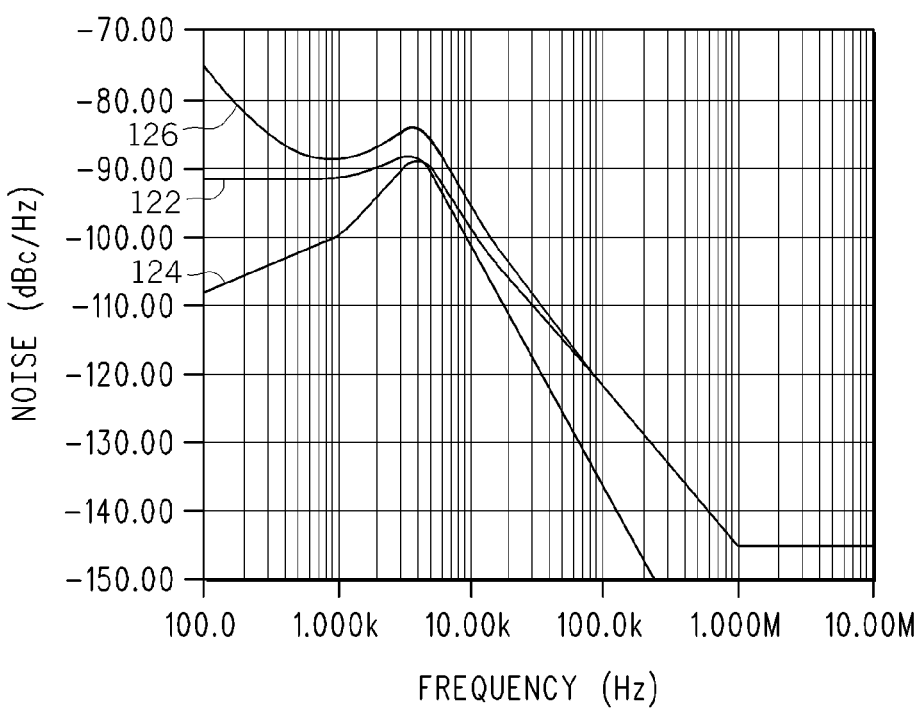
FIG. 7 is a graphical diagram of the total phase loop noise of a phase locked loop circuit using the loop filter of FIG. 5 with the capacitance multiplier circuit of FIG. 3 substituted for the capacitor C1, including the loop filter noise contribution and the voltage-controlled oscillator (VCO) noise contribution, as a function of frequency.

Referring now to FIG. 7, shown is a graphical diagram 120 of the total phase loop noise of a phase locked loop circuit using the loop filter of FIG. 5. However, the capacitor 96 (C1) in the loop filter of FIG. 5 was substituted or replaced with a five times (5×) capacitance multiplier circuit configured in the manner of the capacitance multiplier circuit 30 of FIG. 3. The graphical diagram 120 includes a plot 122 of the loop filter noise, a plot 124 of the VCO noise, and a plot 126 of the total loop noise in the PLL circuit. As the plot 122 of the loop filter noise shows, at frequencies below 5 KHz, the capacitance multiplier degrades the loop filter noise contribution relative to a passive filter, i.e., relative to the loop filter 90 in FIG. 5. However, as the plot 126 of the total loop noise shows, the total loop noise is comparable to that of the passive loop and shows only minor degradation from a frequency range of 200 Hz to 8 KHz, with little degradation beyond a frequency of 10 KHz.

Figure 8:
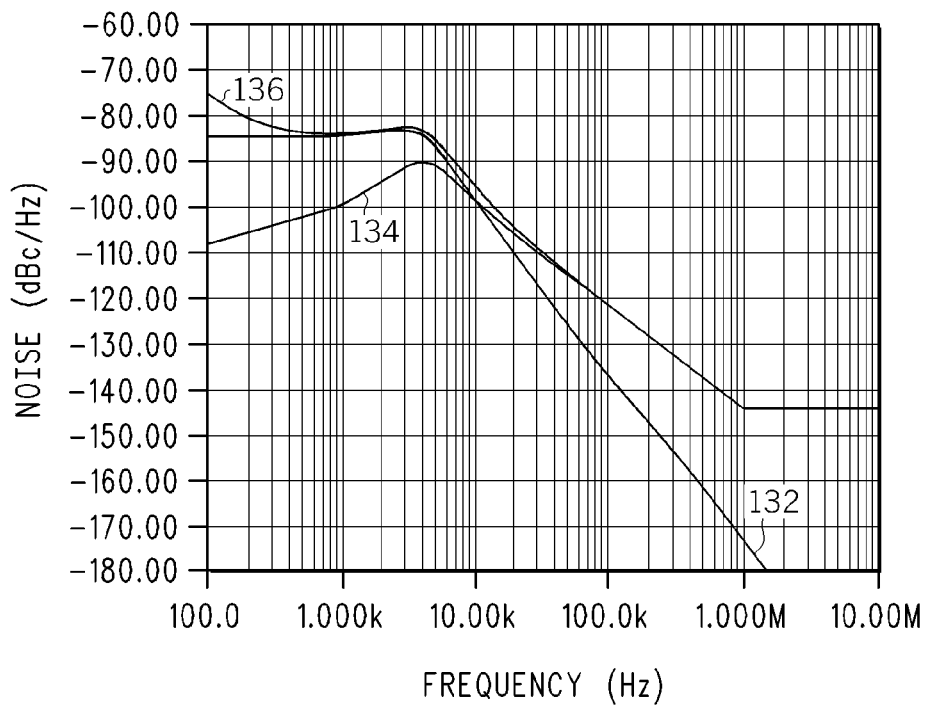
FIG. 8 is a graphical diagram of the total phase loop noise of a phase locked loop circuit using the loop filter of FIG. 5 with the conventional capacitance multiplier circuit of FIG. 1 substituted for the capacitor C1, including the loop filter noise contribution and the voltage-controlled oscillator (VCO) noise contribution, as a function of frequency.

Referring now to FIG. 8, shown is a graphical diagram 130 of the total phase loop noise of a phase locked loop circuit using the loop filter of FIG. 5. However, the capacitor 96 (C1) in the loop filter of FIG. 5 was substituted or replaced with the conventional capacitance multiplier circuit 10 of FIG. 1. The graphical diagram 130 includes a plot 132 of the loop filter noise, a plot 134 of the VCO noise, and a plot 136 of the total loop noise in the PLL circuit. As can be seen from the graphical diagram 130, from 200 Hz to 8 KHz, the noise levels are approximately 8 dB higher than the levels shown in the graphical diagram 120 in FIG. 7, i.e., using the capacitance multiplier circuit 30 of FIG. 3. The noise levels at 25 KHz are slightly degraded, e.g., by approximately 1 dB.

Figure 9:
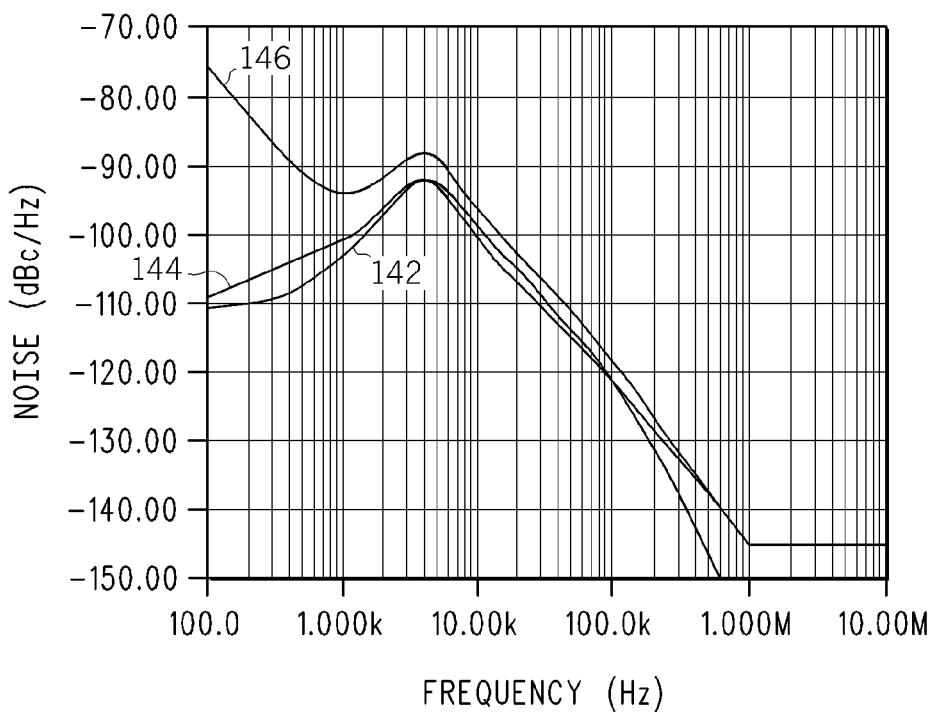
FIG. 9 is a graphical diagram of the total phase loop noise of a phase locked loop circuit using a conventional operational amplifier loop filter that does not include a capacitance multiplier, including the loop filter noise contribution and the voltage-controlled oscillator (VCO) noise contribution, as a function of frequency.

Referring now to FIG. 9, shown is a graphical diagram 140 of the total phase loop noise of a phase locked loop circuit using a conventional op amp loop filter (not shown) that does not include a capacitance multiplier circuit. The graphical diagram 140 includes a plot 142 of the loop filter noise, a plot 144 of the VCO noise, and a plot 146 of the total loop noise in the PLL circuit. As shown by the graphical diagram 140, the use of a conventional op amp loop filter has relatively good noise performance within the loop bandwidth (i.e., 5 kHz), but has relatively severe degradation at frequencies above 10 KHz.

In general, the graphical diagrams in FIG. 6 through FIG. 9 show that the passive loop filter, e.g., the loop filter 90 in FIG. 5, may have the better overall noise performance. However, in cases where it is desirable to reduce the size of the loop filter capacitor, the inventive capacitance multiplier circuit, e.g., the capacitance multiplier circuit 30 shown in FIG. 3, provides a lower noise solution than a conventional current mirror multiplier circuit, e.g., the capacitance multiplier circuit 10 shown in FIG. 1, and is much better than a conventional op amp loop filter when frequencies greater than the loop bandwidth are of interest.

It should be understood that the inventive variable capacitance multiplier circuits shown and described hereinabove are not limited to phase locked loop applications. Also, although the transistors shown and described herein are shown as bipolar junction transistors (BJTs), it should be understood that one or more of the transistors can be field effect transistors (FETs).

It will be apparent to those skilled in the art that many changes and substitutions can be made to the capacitance multiplier circuits herein described without departing from the spirit and scope of the invention as defined by the appended claims and their full scope of equivalents.

The invention claimed is:

1. An integrated circuit including a capacitance multiplier, comprising:
   a reference capacitor coupled between a first node and a second node, wherein the reference capacitor has a reference capacitor current; and
   a current mirror arrangement coupled between the second node and a point of reference potential, wherein the current mirror arrangement includes
      a first transistor Q1 having a first terminal coupled to the second node,
      a second transistor Q2 having a first terminal coupled to the first node and
      an operation amplifier coupled between the second node and a second terminal of the first transistor and the second transistor Q2 and the point of reference potential,
   wherein the current mirror arrangement has a current gain factor N, and wherein the current mirror arrangement varies the capacitance of the reference capacitor by a factor of N+1, based on the reference capacitor current.

2. The integrated circuit as recited in claim 1, wherein the current mirror arrangement includes:
   a first resistor R1 coupled between the second terminal of the first transistor Q1 and an output of the operation amplifier, and
   a second resistor R2 coupled between the second terminal of the second transistor Q2 and the output of the and the operation amplifier.

3. The integrated circuit as recited in claim 2, wherein the first resistor R1 and the second resistor R2 are configured in such a way that reduces the amount of noise introduced to the capacitance multiplier by the first transistor Q1 and the second transistor Q2.

4. The integrated circuit as recited in claim 1, wherein the current gain factor N is the ratio of the area of Q2 to the area of Q1.

5. The integrated circuit as recited in claim 1, further comprising a bias current source arrangement coupled to the reference capacitor and coupled to the current mirror arrangement.

6. The integrated circuit as recited in claim 1, wherein the current mirror arrangement is configured in such a way that reduces the amount of parasitic resistance within the capacitance multiplier.

7. An integrated circuit including a phase-locked loop (PLL) loop filter circuit, comprising:
   a loop filter capacitor coupled between a first node and a first intermediate node;
   a loop filter resistor coupled between the first node and the first intermediate node;
   a capacitance multiplier coupled between the intermediate node and a point of reference potential,
   wherein the capacitance multiplier includes
      a reference capacitor coupled between the first intermediate node and a second intermediate node, wherein the reference capacitor has a reference capacitor current associated therewith, and
      a current mirror arrangement coupled between the second intermediate node and the point of reference potential, wherein the current mirror arrangement includes
         a first transistor Q1 having a first terminal coupled to the second intermediate node,
         a second transistor Q2 having a first terminal coupled to the first intermediate node, and
         an operation amplifier coupled between the second intermediate node and a second terminal of the first transistor and, the second transistor Q2 and the point of reference potential,
      wherein the current mirror arrangement is configured in such a way that reduces the amount of parasitics within the capacitance multiplier.

8. The integrated circuit as recited in claim 7, wherein the current mirror arrangement is configured in such a way that reduces the amount of noise introduced to the capacitance multiplier by at least a portion of the current mirror arrangement.

9. The integrated circuit as recited in claim 7, wherein the current mirror arrangement has a gain factor N, and wherein the current mirror arrangement varies the capacitance of the reference capacitor by a factor of N+1, based on the reference capacitor current.

10. The integrated circuit as recited in claim 7, wherein the current mirror arrangement includes:
    a first resistor R1 coupled between the second terminal of the first transistor Q1 and an output of the operation amplifier, and
    a second resistor R2 coupled between the second terminal of the second transistor Q2 and an output of the and the operation amplifier.

11. The integrated circuit as recited in claim 10, wherein the current gain factor N is the ratio of the area of Q2 to the area of Q1.

12. The integrated circuit as recited in claim 7, further comprising a bias current source arrangement coupled to the reference capacitor and coupled to the current mirror arrangement, wherein the bias current source arrangement determines the current through the current mirror arrangement, which varies the reference capacitor current.

13. The integrated circuit as recited in claim 7, wherein the first node is an input node, and wherein the integrated circuit further comprises a third loop filter resistor coupled between the input node and an output node, and a third loop filter capacitor coupled between the output node and the point of reference potential.

* * * * *